(12) United States Patent
Fujita et al.

(10) Patent No.: US 6,538,390 B2
(45) Date of Patent: Mar. 25, 2003

(54) ORGANIC LED DISPLAY DEVICE OF ACTIVE MATRIX DRIVE TYPE AND FABRICATION METHOD THEREFOR

(75) Inventors: Yoshimasa Fujita, Kashihara (JP); Kazuo Ban, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/907,807

(22) Filed: Jul. 19, 2001

(65) Prior Publication Data

US 2002/0047567 A1 Apr. 25, 2002

(30) Foreign Application Priority Data

Sep. 6, 2000 (JP) ........................................ 2000-270252

(51) Int. Cl.[7] ................................................ G09G 3/10
(52) U.S. Cl. ................ 315/169.3; 315/169.1; 257/350; 257/59
(58) Field of Search ............................ 315/169.3, 169.1; 257/59, 72, 350, 351

(56) References Cited

U.S. PATENT DOCUMENTS

| | | | | |
|---|---|---|---|---|
| 6,153,893 A | * | 11/2000 | Inoue et al. | 257/408 |
| 6,246,070 B1 | * | 6/2001 | Yamazaki et al. | 257/347 |
| 6,351,010 B1 | * | 2/2002 | Yamanaka et al. | 257/350 |

FOREIGN PATENT DOCUMENTS

| | | |
|---|---|---|
| JP | 2-37385 | 2/1990 |
| JP | 7-111341 | 4/1995 |
| JP | 7-122360 | 5/1995 |
| JP | 7-122361 | 5/1995 |
| JP | 7-153576 | 6/1995 |
| JP | 8-227276 | 9/1996 |
| JP | 8-241047 | 9/1996 |
| JP | 10-12377 | 1/1998 |
| JP | 10-189252 | 7/1998 |
| JP | 10-208881 | 8/1998 |
| JP | 11-260549 | 9/1999 |
| JP | 11-273859 | 10/1999 |

OTHER PUBLICATIONS

"Important Issues and Commercialization Strategy for Organic EL Device", The Japanese Research Association for Organic Electronics Materials, Bunshin Publishing Co., Tokyo, Japan; Jul. 1999, pp. 55–61.

"Important Issues and Commercialization Strategy for Organic EL Device"; The Japanese Research Association for Organic Electronics Materials, Bunshin Publishing Co., Tokyo, Japan; Jul. 1999, pp. 62–69.

Dawson et al., "The Impact of the Transient Response of Organic Light Emitting Diodes on the Design of Active Matrix OLED Displays", IEDM, 1998, pp. 875–878.

Dawson et al, "4.2: Design of an Improved Pixel for a Polysilicon Active–Matrix Organic LED Display", SID 98 Digest, 1998, pp. 11–14.

* cited by examiner

*Primary Examiner*—Haissa Philogene
(74) *Attorney, Agent, or Firm*—Nixon & Vanderhye P.C.

(57) ABSTRACT

An organic LED display device of active matrix drive type comprises: a substrate; a thin film transistor provided on the substrate; a planarization film provided over the thin film transistor; and an organic LED device provided on the planarization film, and comprising a pixel electrode electrically connected to a drain electrode of the thin film transistor via an interconnection extending through the planarization film, an organic LED layer comprising at least one organic light emitting layer, and a counter electrode; the thin film transistor being operative to control one of a current and a voltage to be applied to the LED device; wherein the interconnection has an end face flush with a surface of the planarization film on a pixel electrode side.

9 Claims, 8 Drawing Sheets

ORGANIC LED DISPLAY DEVICE OF ACTIVE MATRIX DRIVE TYPE AND FABRICATION METHOD THEREFOR

CROSS-REFERENCE TO RELATED APPLICATION

This application is related to Japanese application No. 2000-270252 filed on Sep. 6, 2000, whose priority is claimed under 35 USC §119, the disclosure of which is incorporated by reference in its entirety.

BACKGROUND OF THE INVENTION

1. Field of the Invention

The present invention relates to an organic LED (light emitting diode) display device of active matrix drive type and to a fabrication method therefor. More specifically, the invention relates to an organic LED display device of active matrix drive type employing thin film transistors and the like and to a fabrication method therefor.

2. Description of the Related Art

A known technique for displaying a motion picture on an organic LED display device is based on simple matrix driving (for example, Japanese Unexamined Patent Publication No. 2-37385 (1990), and "Important Issues and Commercialization Strategy for Organic LED Device" p.55).

In the aforesaid driving method, scanning lines are sequentially driven. For driving a greater number of scanning lines (e.g., several hundreds scanning lines), an instantaneous luminance of several hundred thousands to several millions $cd/m^2$ is required, and the driving method encounters the following problems.

(1) A higher driving voltage is required, so that interconnections suffer from a greater voltage drop.
(2) The driving is required in a lower luminous efficiency area in a higher luminance region, so that power consumption is increased.

To solve these problems, organic LED display devices have been developed which employ thin film transistors for active matrix driving (for example, Japanese Unexamined Patent Publications No. Hei 7(1995)-122360, No. Hei 7 (1995)-122361, No. Hei 7 (1995)-153576, No. Hei 8 (1996)-241047 and No. Hei 8(1996)-227276, "Important Issues and Commercialization Strategy for Organic LED Device" p.62, IEDM98 p.875).

The organic LED display devices employing the active matrix driving method can be driven at a lower voltage. Since the driving in the higher luminous efficiency area is possible, the power consumption can significantly be reduced. Thus, the active matrix organic LED display devices are superior to the simple matrix organic LED display devices.

However, the organic LED display devices employ two or more thin film transistors for driving each pixel and, therefore, have a significantly reduced aperture ratio as compared with liquid crystal display devices (Japanese Unexamined Patent Publication No. Hei 7(1995)-111341, SID98 p.11).

To increase the pixel aperture ratio, there has been proposed a display structure such that an organic LED device including a pixel electrode, an organic LED layer and a counter electrode overlies thin film transistors with the intervention of an insulating film, and light emitted therefrom is outputted from an opposite side of a substrate (for example, Japanese Unexamined Patent Publication No. Hei 10(1998)-189252).

For patterning of an organic layer (typically, a light emitting layer) for formation of an organic LED layer, there have been proposed a masked evaporation method (Japanese Unexamined Patent Publication No. Hei 8(1996)-227276) and an ink jet method (Japanese Unexamined Patent Publication No. Hei 10(1998)-12377).

With the masked evaporation method, however, it is very difficulty to produce LED devices on a greater size substrate. Further, the ink jet method requires much time for producing LED devices on a greater size substrate.

To cope with these problems, there have been proposed a transfer method (Japanese Unexamined Patent Publications No. Hei 10(1998)-208881 and No. Hei 11(1999)-260549) and a printing method (Japanese Unexamined Patent Publication No. Hei 11(1999)-273859) as a patterning method which can significantly reduce the time required for the production of the LED devices on the greater size substrate.

Where the organic LED layer of the organic LED display device has an extremely small thickness on the order of several hundreds nanometers or smaller, however, undulations on an underlying layer attributed to the presence of the thin film transistors or the presence of contact holes, which will pose no problem in the case of a liquid crystal layer, may cause an inter-electrode short, degradation of the organic LED layer due to field concentration, and deterioration in display quality.

Particularly, where the printing method is employed for the formation of the organic LED layer, even slight undulations on a substrate to be formed with the organic LED layer may produce gaps between a transfer plate and the substrate, so that the transfer plate cannot be brought into intimate contact with the substrate. Therefore, the organic LED layer suffers from a printing failure and variations in thickness. This may also cause an inter-electrode short, degradation of the organic LED layer due to field concentration, and deterioration in display quality due to variations in luminance.

Where the transfer method is employed for the formation of the organic LED layer, the slight undulations prevent an organic LED layer formed on a transfer base film from being brought into intimate contact with the substrate, thereby causing the aforesaid problems.

SUMMARY OF THE INVENTION

In view of the foregoing, the present invention is directed to an organic LED display device of active matrix drive type which is free from an inter-electrode short, degradation of an organic LED layer due to field concentration, and deterioration in display quality due to variations in luminance, which may otherwise occur due to undulations on a substrate, a pixel electrode or the like. The invention is further directed to a method for fabricating such a display device.

In accordance with one aspect of the present invention, there is provided an organic LED display device of active matrix drive type comprising: a substrate; a thin film transistor provided on the substrate; a planarization film provided over the thin film transistor; and an organic LED device provided on the planarization film, and comprising a pixel electrode electrically connected to a drain electrode of the thin film transistor via an interconnection extending through the planarization film, an organic LED layer comprising at least one organic light emitting layer, and a counter electrode; the thin film transistor being operative to control one of a current and a voltage to be applied to the LED device; wherein the interconnection has an end face flush with a surface of the planarization film on a pixel electrode side.

In accordance with another aspect of the present invention, there is provided a method for fabricating an organic LED display device of active matrix drive type which comprises an organic LED device and a thin film transistor connected to the organic LED device for controlling a current or a voltage to be applied to the LED device, the method comprising the steps of: forming the thin film transistor on a substrate; forming a planarization film over the thin film transistor; forming a contact hole in the planarization film; forming an interconnection in the contact hole so as to has an end face flush with a surface of the planarization film; forming a pixel electrode on the planarization film formed with the interconnection; forming an organic LED layer including at least one light emitting layer on the pixel electrode; and forming a counter electrode on the organic LED layer.

DETAILED DESCRIPTION OF THE INVENTION

An organic LED display device of active matrix drive type according to the present invention essentially includes a substrate, thin film transistor formed on the substrate, a planarization film formed over the thin film transistor on the substrate, and organic LED device electrically connected to the thin film transistor.

The substrate to be used for the inventive display device is not particularly limited, but examples thereof include: insulating substrates formed of an inorganic material such as glass or quartz, a plastic material such as polyethylene terephthalate, and a ceramic material such as alumina; metal substrates such as of aluminum or iron coated with an insulation material such as $SiO_2$ or an organic insulation material; and metal substrates such as of aluminum having a surface subjected to an insulating treatment such as anodic oxidation. The substrate may be transparent, translucent, opaque or light-proof.

Where the thin film transistor is to be produced by employing polysilicon formed through a low temperature process, the substrate is preferably unmeltable and free from distortion at temperatures not higher than 500° C. Where the thin film transistor is to be produced by employing polysilicon formed through a high temperature process, the substrate is preferably unmeltable and free from distortion at temperatures not higher than 1000° C.

Where light emitted from the LED device is to be outputted from a substrate side of the inventive display device, the substrate is preferably a transparent substrate. Where light emitted from the LED device is to be outputted from a side opposite from the substrate (from an LED device side), the substrate may be a light-proof substrate having a light shielding property.

Any known thin film transistor may be employed as the thin film transistor in the inventive display device. More specifically, the thin film transistor includes an active layer having source/drain regions and a channel region, a gate insulating film, and a gate electrode. The structure of the thin film transistor is not particularly limited, but may be of a stagger type, an inverted stagger type, a top gate type, a coplanar type or the like.

The active layer is not particularly limited, but may be composed, for example, of an inorganic semiconductor material such as amorphous silicon, polycrystalline silicon, microcrystalline silicon or cadmium selenide, or an organic semiconductor material such as a thiophene oligomer or poly(p-phenylene vinylene). Formation of the active layer may be achieved, for example, by forming an amorphous silicon layer by a plasma CVD method and then ion-doping the amorphous silicon layer; by forming an amorphous silicon layer with the use of $SiH_4$ gas by an LPCVD method, crystallizing the amorphous silicon layer by a solid phase epitaxy method for formation of a polysilicon layer, and ion-doping the polysilicon layer by an ion implantation method; by forming an amorphous silicon layer with the use of $Si_2H_6$ gas by an LPCVD method or with the use of $SiH_4$ gas by a PECVD method, annealing the amorphous silicon layer by a laser such as excimer laser to crystallize the amorphous silicon layer for formation of a polysilicon layer, and ion-doping the polysilicon layer by an ion doping method (low temperature process); or by forming a polysilicon layer by a reduced pressure CVD method or an LPCVD method, thermally oxidizing the polysilicon layer at 1000° C. or higher for formation of a gate insulating film, forming a gate electrode of $n^+$ polysilicon on the gate insulating film, and ion-doping the polysilicon layer by an ion implantation method (high temperature process).

The gate insulating film may be any conventional gate insulating film, and examples thereof include a $SiO_2$ film formed by a PECVD method or an LPCVD method, and an $SiO_2$ film formed by thermally oxidizing a polysilicon film.

The gate electrode may be any conventional gate electrode, and exemplary materials therefor include metals such as aluminum and copper, high melting point metals such as titanium, tantalum and tungsten, polysilicon, silicides and polycides of high melting point metals.

The thin film transistor to be employed in the present invention may be of a single gate structure, a double gate structure, or a multi-gate structure having three or more gate electrodes. Further, the thin film transistor may have an LDD and DDD structure or an offset structure. Two or more thin film transistors may be provided in each pixel.

Any known organic LED device may be employed as the organic LED device in the inventive display device. For example, the organic LED device includes an organic LED layer having at least one organic light emitting layer, a pixel electrode and a counter electrode.

The organic LED layer is not particularly limited but, for example, may be of a single layer structure or a laminate structure having:

(1) an organic light emitting layer;
(2) a hole transporting layer and an organic light emitting layer;
(3) an organic light emitting layer and an electron transporting layer;
(4) a hole transporting layer, an organic light emitting layer and an electron transporting layer;
(5) a hole injecting layer, a hole transporting layer, an organic light emitting layer and an electron transporting layer; or
(6) a buffer layer, a hole transporting layer, an organic light emitting layer, and an electron transporting layer.

The organic light emitting layer may be of a single layer structure or a multi-layer structure. A light emitting material to be used for the organic light emitting layer may be any known light emitting material for organic LEDs. Examples thereof include: low molecular light emitting materials (e.g., fluorescent organic materials including aromatic dimethylidene compounds such as 4,4'-bis(2,2-diphenylvinyl) biphenyl (DPVBi), oxadiazole compounds such as 5-methyl-2-[2-[4-(5-methyl-2-benzoxazolyl)phenyl]vinyl] benzoxazole, triazole compounds such as 3-(4-biphenylyl)-4-phenyl-5-t-butylphenyl-1,2,4-triazole (TAZ), styrylbenzene compounds such as 1,4-bis(2-methylstyryl)benzene, thiopyrazine oxide derivatives, benzoquinone derivatives, naphthoquinone derivatives, anthraquinone derivatives, diphenoquinone derivatives and fluorenone derivatives, and fluorescent organic metal compounds such as azomethine zinc complexes and (8-hydroxyquinolinato)aluminum complexes ($Alq_3$)); polymeric light emitting materials (e.g., poly(2-decyloxy-1,4-phenylene) (DO-PPP), poly[2,5-bis[2-(N,N,N-triethylammonium)ethoxy]-1,4-phenyl-alto-1,4-phenylene]dibromide (PPP-$NEt_3^+$), poly[2-(2'-ethylhexyloxy)-5-methoxy-1,4-phenylene vinylene] (MEH-PPV), poly[5-methoxy-(2-propanoxysulfonide)-1,4-phenylene vinylene] (MPS-PPV), poly[2,5-bis(hexyloxy)-1,4-phenylene-(1-cyanovinylene)] (CN-PPV), and poly(9,9-dioctylfluorene) (PDAF)); and precursors of polymeric light emitting materials (e.g., precursors of PPV, PNV and PPP).

The organic light emitting layer may be composed of any of the aforesaid light emitting materials alone, or contain a hole transporting material, an electron transporting material, an additive (a donor, an acceptor or the like) or a luminescent dopant, which may be dispersed in a polymeric material or an inorganic material.

The charge transporting layers (the hole transporting layer and the electron transporting layer) may be of a single layer structure or a multi-layer structure. Charge transporting materials to be used for the charge transporting layers may be any known charge transporting materials for organic LEDs and organic photoconductors, but are not particularly limited. Examples of the charge transporting materials include: hole transporting materials (e.g., inorganic p-type semiconductor materials, low molecular materials including porphyrin compounds, aromatic tertiary amine compounds such as N,N'-bis(3-methylphenyl)N,N'-bisphenyl-benzidine (TPD) and N,N'-di(naphthalene-1-yl)-N,N'-diphenyl-benzidine (NPD), hydrazone compounds, quinacridone compounds and styrylamine compounds, polymeric materials including polyaniline (PANI), 3,4-polyethylene dioxythiophene/polystyrene sulfonate (PEDT/PSS), poly [triphenylamine derivative] (poly-TPD) and polyvinylcarbazole (PVCz), and precursors of polymeric materials such as a precursor of poly(p-phenylene vinylene) (Pre-PPV) and a precursor of poly(p-naphthalene vinylene) (Pre-PNV)); and electron transporting materials (e.g., inorganic n-type semiconductor materials, low molecular materials including oxadiazole derivatives, triazole derivatives, thiopyrazine oxide derivatives, benzoquinone derivatives, naphthoquinone derivatives, anthraquinone derivatives, diphenoquinone derivatives and fluorenone derivatives, and polymeric materials including poly[oxadiazole derivative] (Poly-OXZ)). The charge transporting layers may be composed of any of the aforesaid charge transporting materials alone, or contain an additive or the like. The charge transporting material may be dispersed in a polymeric material or an inorganic material.

Formation of the light emitting layer and the charge transporting layers is achieved, for example, by a wet process such as a coating method (e.g., a spin coating method, a dipping method or a doctor blade method), an ink jet method or a printing method, or by a dry process such as an evaporation method, a vacuum evaporation method or a laser transfer method (Japanese Unexamined Patent Publication No. Hei 11(1999)-260549). Among these methods, the printing method or the laser transfer method is preferred in consideration of production of a greater display area, productivity, production speed and the like.

The printing method is not particularly limited, but examples thereof include a relief printing method, an intaglio printing method, a lithographic printing method and an offset printing method, among which the relief printing method, the intaglio printing method and the lithographic printing method are preferred for formation of a uniform thin film having a thickness of 1 $\mu$m or smaller, and the relief printing method is preferred for formation of a uniform thin film having a thickness of 1000 Å or smaller.

In the printing method, for example, the light emitting material or the charge transporting material is dissolved or dispersed in a suitable solvent for preparation of a light emitting layer material liquid or a charge transporting layer material liquid, and the liquid is ejected, dripped or printed onto the pixel electrode, the charge transporting layer or the light emitting layer and dried for the formation of the light emitting layer or the charge transporting layer.

Figure 12:
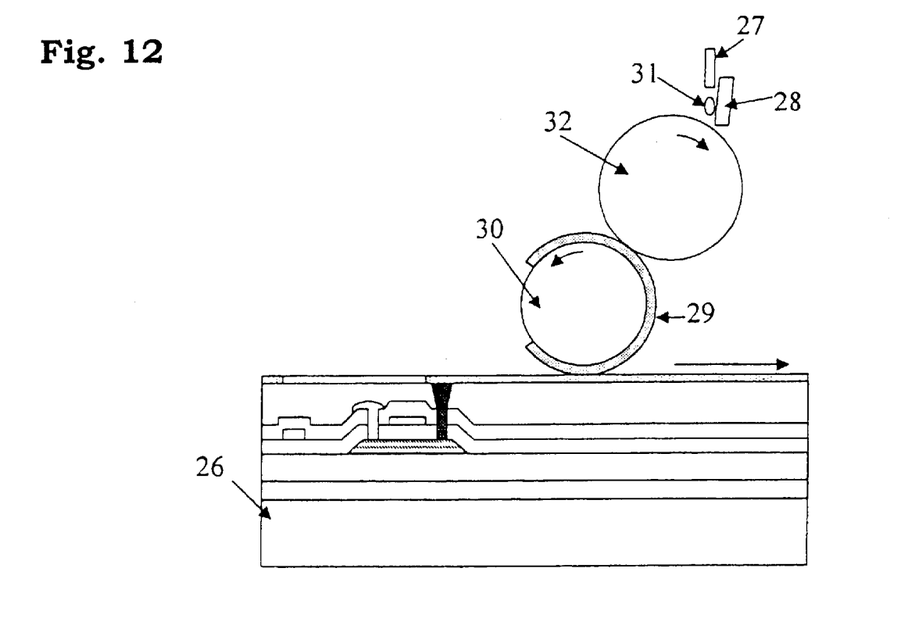
FIG. 12 is a schematic sectional diagram for explaining a printing method to be employed for fabrication of the organic LED display device of active matrix drive type according to the present invention.

A commercially available printer may be employed in the printing method. As shown in FIG. 12, a coating liquid 31 ejected from a nozzle 27 is spread by a blade 28 on a roll 32 on which the coating liquid 31 is temporarily retained. subsequently, the coating liquid 31 is transferred from the roll 32 onto a transfer plate 29 fixed around a transfer plate fixture roll 30, and then transferred onto a substrate supported by a substrate holder 26.

Where a resin substrate such as of a plastic is employed as the substrate, the transfer plate 29 is preferably made of a metal material or a resin material. Where a substrate of an inorganic material such as glass is employed as the substrate, the transfer plate 29 is preferably made of a resin material in consideration of a damage to the substrate. More specifically, a copper plate may be employed as the metal transfer plate, and APR (Asahi Kasei Co., Ltd.) or FUJI TORELIEF (Fuji Film Co., Ltd.) may be employed as the resin transfer plate. The surface of the transfer plate 29 is preferably formed with an undulation pattern or a pattern including portions having a lower wettability and a higher wettability with respect to the coating liquid.

Figure 13:
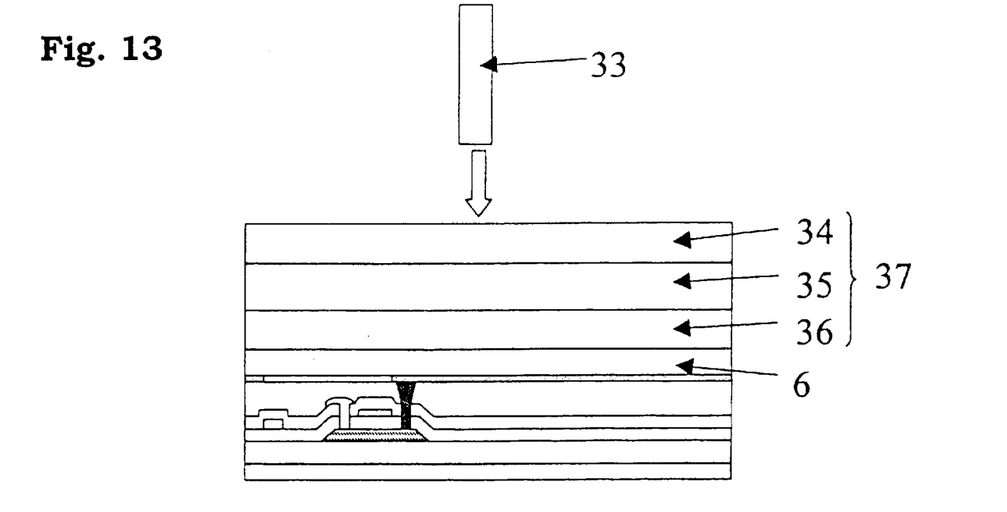
FIG. 13 is a schematic sectional diagram for explaining a laser transfer method to be employed for fabrication of the organic LED display device of active matrix drive type according to the present invention.

In the transfer method, a base film 37 having an organic LED layer 6 or a charge transporting layer (not shown) provided on a film 34 with the intervention of a light-to-heat converting layer 35 and a heat conducting layer 36 is mated with the substrate, and a laser beam 33 is applied onto desired portions of the film as shown in FIG. 13. Thus, the light emitting layer or the charge transporting layer is transferred from the film onto the substrate. The organic LED layer or the charge transporting layer may be of a single layer structure or a multi-layer structure. Formation of the organic LED layer or the charge transporting layer on the film may be achieved by a dry process such as a vacuum evaporation method, or by a wet process such as a dip coating method, a spin coating method or an ink jet method. An electrode layer may be formed on the organic LED layer or the charge transporting layer of the film, so that these layers can simultaneously be transferred onto the substrate.

The pixel electrode is not particularly limited, but may be composed of any conventional electrode material. The pixel electrode is typically paired with a counter electrode, and serves as an anode or a cathode. Usable as the anode are metal electrodes such as of Au, Pt and Ni having a higher work function, and transparent electrodes such as of ITO, IDIXO and $SnO_2$. Usable as the cathode are metal electrodes such as of Ca, Al, an Mg—Ag alloy and an Li—Al alloy having a lower work function, and combination electrodes including a thin insulating layer and a metal electrode (e.g., LiF/Al). An EB method, a sputtering method, a resistance heating evaporation method or a laser transfer method may be employed for formation of the pixel electrode, and a photolithography method may be employed for patterning. Where the emitted light is outputted from a pixel electrode side, the transparent electrode is preferably employed as the pixel electrode. The thickness of the pixel electrode is not particularly limited, but may properly be adjusted depending on the size and performance of the display device, the material for the pixel electrode, and the like.

The counter electrode to be paired with the pixel electrode may correspondingly serve as a cathode or an anode. Where the counter electrode serves as the anode, the pixel electrode serves as the cathode. Where the counter electrode serves as the cathode, the pixel electrode serves as the anode. Further, where the emitted light is to be outputted from a counter electrode side, a transparent electrode is preferably employed as the counter electrode. The counter electrode can be formed by an EB method, a sputtering method, a resistance heating evaporation method or the like. In consideration of a thermal damage to the organic LED layer, the resistance heating evaporation method, a laser transfer method or a D.C. reactive sputtering method is preferably employed for the formation of the counter electrode.

The organic LED device in the inventive display device may further comprise a polarization plate, and a sealing film or a sealing plate.

A conventional linear polarization plate and a ¼λ plate may be employed in combination as the polarization plate. This improves the contrast of the display device.

The sealing film or the sealing plate may be formed of a material conventionally employed for the sealing of the display device in a conventional manner. For example, the display device is sealed with a glass or a metal with an inert gas such as nitrogen gas or argon gas filled therein. In this case, a moisture absorber such as barium oxide may be mixed with the inert gas. Alternatively, the sealing film may be formed by spin-coating a resin on the counter electrode or bonding a resin film onto the counter electrode. Thus, intrusion of external oxygen and moisture into the device can be prevented to effectively improve the service life of the device.

In the inventive display device, the planarization film is provided between the thin film transistor and the organic LED device. A material for the planarization film is not particularly limited, but examples thereof include inorganic materials such as $SiO_2$, $SiN(Si_3N_4)$, $TaO(Ta_2O_5)$, $Ni_xZn_yFe_2O_4$ and SOG, and organic materials such as acrylic resins, resist materials and black matrix materials. For formation of the planarization film, any of these materials may be deposited by a dry process such as a sputtering method, a CVD method or a vacuum evaporation method or by a wet process such as a spin coating method, and patterned by a photolithography method or the like. The thickness of the planarization film is not particularly limited, as long as the thickness is sufficient to minimize undulations on the surface of the film or to ensure planarization of the film. For example, the thickness of the planarization film is preferably greater than the thickness of the thin film transistor.

In the present invention, an interlayer insulating film may further be provided between the thin film transistor and the planarization film. Examples of a material for the interlayer insulating film include resin materials such as acrylic resins and polyimide resins, materials prepared by dispersing a pigment or a dye such as carbon black, phthalocyanine or quinacridone in a resin such as polyimide, inorganic materials such as $SiO_2$, $SiN(Si_3N_4)$, $TaO(Ta_2O_5)$, $Ni_xZn_yFe_2O_4$ and SOG, and photosensitive materials. For formation of the interlayer insulating film, any of these materials may be deposited by a dry process such as a sputtering method, a CVD method or a vacuum evaporation method or by a wet process such as a spin coating method, and patterned by a photolithography method or the like. The thickness of the interlayer insulating film is not particularly limited, but may properly be adjusted depending on the material to be employed.

In the inventive display device, the thin film transistor should function as switching elements for the organic LED device, so that drain electrode of the thin film transistor is electrically connected to the pixel electrode of the organic LED device.

The connection between the drain electrode of the thin film transistor and the pixel electrode of the organic LED device is achieved through interconnection formed in contact hole extending through the planarization film (and the interlayer insulating film optionally provided).

The shape, number, positions and size of the contact hole may be determined so as to ensure proper electrical connection between the drain electrode and the pixel electrode. For example, the contact hole preferably have a greater size on the substrate side (on the thin film transistor side) than on a pixel electrode side. Thus, the interconnection to be described later can assuredly be formed in the contact hole without breakage thereof. Where the emitted light is outputted from the substrate side, a smaller number of contact hole is preferably formed above the thin film ransistor (drain electrode) or above the vicinity of the thin film transistor with the need for increase in the aperture ratio. On the other hand, where the emitted light is outputted from the side opposite from the substrate, the aperture ratio does not depend on the number and positions of the contact hole. To ensure uniform current flow of the pixel electrode, for example, one contact hole is provided adjacent the center of each pixel (or the organic LED device), or a plurality of contact holes are equidistantly formed in each pixel with one of them disposed adjacent the center of the pixel. Where the contact hole is formed in a position apart from the drain electrode, a connection electrode is preferably formed for electrical connection between the drain electrode and the interconnection to be formed in the contact hole. Formation of the connection electrode may be achieved by employing a formation method and a material conventionally known in the art.

The contact hole may be formed by a known method. For example, a photosensitive material is employed as the material for the planarization film and the contact hole is formed in the photosensitive planarization film by a photolithography method. Alternatively, a photosensitive material layer is formed on the planarization film and patterned by a photolithography method, and the planarization film is etched for the formation of the contact hole, or the planarization film is irradiated with a laser beam for the formation of the contact hole.

A material for the interconnection to be formed in the contact hole may be any electrically conductive material typically used for electrode and interconnection. The formation of the interconnection may be achieved by a known method such as a sputtering method or an evaporation method. However, it is necessary to form the interconnection independently of the pixel electrode. The independent formation virtually ensures planarization of the pixel electrode. More specifically, an electrically conductive interconnection material is deposited on the planarization film formed with the contact hole, and the resulting layer of the electrically conductive interconnection material is polished away for the formation of the interconnections in the contact hole and for the planarization of the planarization film. The layer of the electrically conductive interconnection material preferably has a thickness equal to or slightly smaller or greater than the depth of the contact hole. The polishing is preferably achieved, for example, by a CMP method.

In the inventive display device, the connection between the organic LED device and the thin film transistor may be arranged so that an organic LED device in each pixel is driven by a single thin film transistor or by a plurality of thin film transistors. Further, at least one capacitor or the like may be employed in combination with the thin film transistor for the driving of the organic LED device. As in a typical light emitting display device, signal electrode line, scanning electrode line, common electrode line, first drive electrode line and second drive electrode line are provided in the inventive display device, and these electrode lines may be formed, for example, of a metal such as Ta, Al or Cu.

With reference to the attached drawings, the organic LED display device of active matrix drive type and the fabrication method therefor according to the present invention will hereinafter be described by way of embodiments thereof.

Embodiment 1

Figure 3:
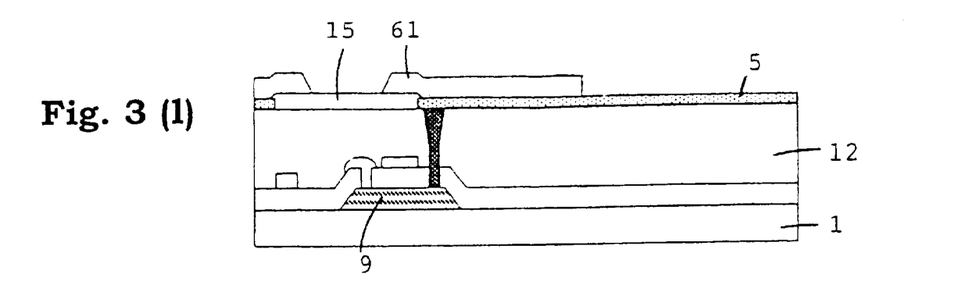
Figure 4:
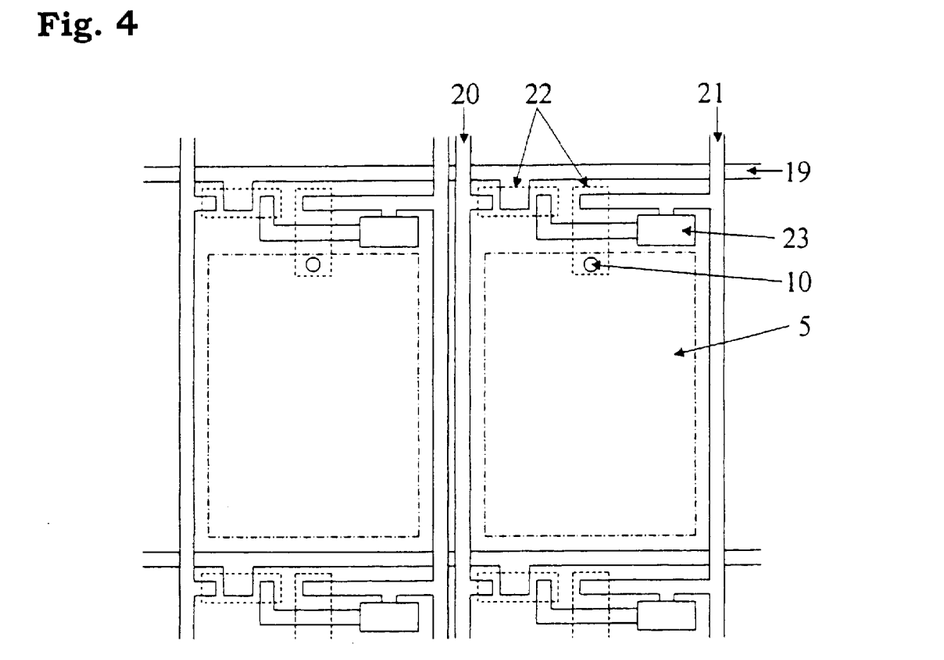
FIG. 4 is a schematic plan view illustrating an organic LED display device of active matrix drive type according to Embodiment 1 of the present invention.

An organic LED display device of active matrix drive type according to this embodiment has at least one thin film transistor 2 and an organic LED device 8 provided on a substrate 1 for each pixel as shown in FIGS. 3(o) and 4.

The thin film transistor 2 includes an active layer 9 provided on the substrate 1 and a gate electrode 11 provided on the active layer 9 with the intervention of a gate insulating film 3.

The organic LED device 8 includes a pixel electrode 5 extending over the pixel, an organic LED layer 6 including a hole transporting layer 61 and an organic light emitting layer 62 provided on the pixel electrode 5, and a counter electrode 7 provided on the organic LED layer 6.

A planarization film 12 is provided over the thin film transistor 2 on the substrate, and the organic LED device 8 is provided on the planarization film 12.

A source electrode 13 is provided on a source region formed in the active layer 9 of the thin film transistor 2. The planarization film 12 has a contact hole formed therein above a drain region of the thin film transistor 2. An interconnection 10 is provided in the contact hole, and the drain region of the thin film transistor 2 is electrically connected to the pixel electrode 5 via the interconnection 10.

A tapered insulating film 15 is provided between each adjacent pair of pixel electrodes 5. A sealing plate 17 is provided on the counter electrode 7, and a polarization plate 18 is provided on an opposite side of the substrate 1.

In FIGS. 3(o) and 4, reference numerals 14 and 19 denote scanning lines, and reference numerals 20, 21, 22 and 23 denote a signal line, a common line, thin film transistor and a capacitor, respectively.

In the display device, emitted light is outputted from the side of the substrate 1. By inputting signal pulses to the signal line (first drive line) and the scanning line (second drive line), the thin film transistor is switched to actuate or deactuate the organic LED device electrically connected to the thin film transistor in the unit pixel for displaying a motion picture and a still image.

The display device was fabricated in the following manner.

Figure 1:
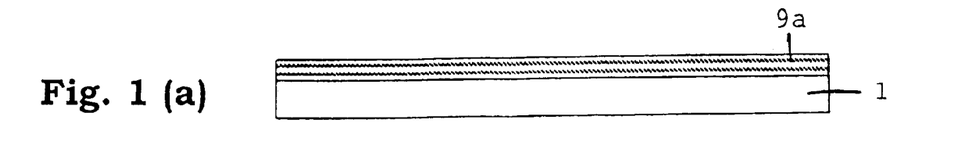
FIGS. 1(a) to 1(f), 2(g) to 2(k), and 3(l) to 3(o) are schematic sectional views for explaining a method for fabricating an organic LED display device of active matrix drive type according to the present invention.

As shown in FIG. 1(a), a 50-nm thick α-Si film was formed on a glass substrate 1 (thickness: 1.1 mm (±10%), resistance>$10^{14}$ Ω·cm, distortion point: 667° C.) by decomposing $Si_2H_6$ by an LP-CVD method, and then polycrystallized by excimer laser annealing for formation of a polysilicon film 9a.

Then, the polysilicon film 9a was patterned into a predetermined configuration, as shown in FIG. 1(b), for formation of active layers 9 in which channel regions and source/drain regions of thin film transistors were to be formed.

As shown in FIG. 1(c), a 50-nm thick gate insulating film 3 of $SiO_2$ was formed on the substrate 1 formed with the active layers 9, and an Al film was formed on the gate insulating film 3 by a sputtering method and patterned for formation of gate electrodes 11. At the same time, formation of lower electrodes (not shown) of capacitors was achieved.

In turn, side faces of the gate electrodes 11 were subjected to anodic oxidization for formation of offset portions, and the active layers 9 were doped with phosphorus in a high concentration by an ion doping method with the use of the gate electrodes 11 as a mask for the formation of the source/drain regions. As shown in FIG. 1(d), scanning lines 14, source electrodes 13, drain electrodes (not shown) and common electrodes (not shown) were formed on the resulting substrate, and then upper electrodes (not shown) of the capacitors were formed on the resulting substrate. Thus, the formation of TFTs 2 was achieved through a low temperature process.

As shown in FIG. 1(e), a 3-μm thick $SiO_2$ film was formed as a planarization film 12 on the resulting substrate.

As shown in FIG. 1(f), a resist was applied on the planarization film 12, and a resist pattern R1 was formed as having openings in contact hole formation regions by a photolithography method. With the use of the resist pattern R1, the planarization film 12 was etched for formation of contact holes, and then the resist pattern R1 was washed away.

Figure 2:
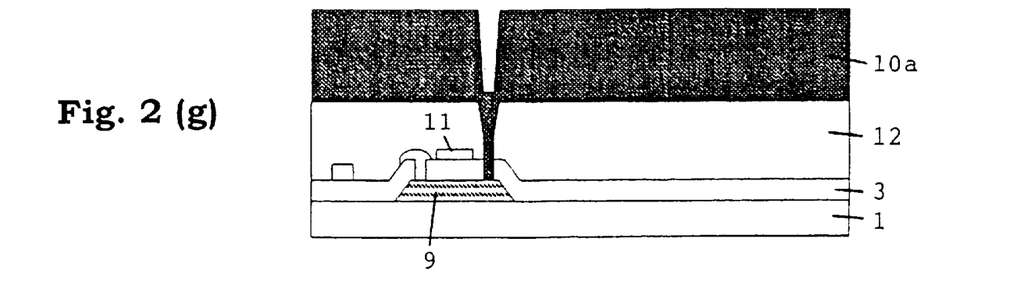

Then, aluminum was deposited to a thickness of 4 μm on the planarization film 12 formed with the contact holes, as shown in FIG. 2(g), for formation of an aluminum film 10a, which was in turn polished away as shown in FIG. 2(h). Thus, interconnections 10 were formed in the contact holes and, at the same time, surfaces of the planarization film 12 and the interconnections 10 were simultaneously planarized.

Thereafter, a 150-nm thick ITO film was formed on the planarization film 12 formed with the interconnections 10 by a sputtering method. For the sputtering, the substrate was kept at 300° C. As shown in FIG. 2(i), the ITO film was patterned into a predetermined configuration for formation of pixel electrodes 5 which were respectively electrically connected to the drain electrodes via the interconnections 10. The pixel electrodes 5 thus formed each had a surface resistance of lower than 10Ω/□, a transmittance of higher than 87% at 550 nm, and a flatness of ±2%.

Then, a 200-nm thick $SiO_2$ film was formed as an insulating film 15a on the resulting substrate as shown in FIG. 2(j). A resist was applied on the $SiO_2$ film, and patterned for formation of a resist pattern R2 of a predetermined configuration.

Subsequently, the $SiO_2$ film was dry-etched with the use of the resist pattern R2 as a mask as shown in FIG. 2(k) for formation of a tapered insulating film 15 between the pixel electrodes. The tapered insulating film prevents the degradation of the devices which may otherwise occur due to field concentration at edges of the pixel electrodes 5 and, where organic LED layers are to be formed by a printing method in the subsequent process, prevents the organic LED layers from suffering from a transfer failure, because a transfer plate of a printer is assuredly brought into intimate contact with the substrate 1.

In turn, a PEDT/PSS aqueous solution was applied on the substrate 1 formed with the pixel electrodes 5 by a spin coating method, as shown in FIG. 3(l), for formation of 50-nm thick hole transporting layers 61.

A coating liquid for blue light emitting layers was prepared by dissolving 1 g of PDAF as a blue light emitting material and 0.0001 g of KF96L-1 (Shinetsu Silicone Co., Ltd.) as a leveling agent in 100 ml of trimethylbenzene. With the use of a commercially available relief printer having a transfer plate 29, the coating liquid for the blue light emitting layers was transferred from the transfer plate 29 selectively onto the hole transporting layers 61, as shown in FIG. 3(m), for formation of organic light emitting layers (blue light emitting layers) 62.

A coating liquid for green light emitting layers was prepared by dissolving 1 g of Pre-PPV as a green light emitting material and 0.0001 g of KF96L-1 (Shinetsu Silicone Co., Ltd.) as a leveling agent in 100 ml of a solvent mixture containing methanol and ethylene glycol in a ratio of 7:3. Then, the coating liquid for the green light emitting layers was transferred selectively onto the hole transporting layers 61 in the same manner as described above for formation of organic light emitting layers (green light emitting layers) 62.

A coating liquid for red light emitting layers was prepared by dissolving 1 g of MEH-PPV as a red light emitting material and 0.0001 g of KF96L-1 (Shinetsu Silicone Co., Ltd.) as a leveling agent in 100 ml of trimethylbenzene. Then, the coating liquid for the red light emitting layers was transferred selectively onto the hole transporting layers 61 in the same manner as described above for formation of organic light emitting layers (red light emitting layers) 62.

The transfer plate 29 herein used was an APR plate (Shore A hardness: 55). The printing pressure for the transfer was 0.1 mm. An anilox roller (300 lines/inch) was used for the printer.

In turn, the resulting substrate was annealed at 120° C. for two hours in a nitrogen atmosphere.

Then, a 50-nm thick cesium film and a 200-nm thick silver film were formed on the resulting substrate by vacuum evaporation method with the use of a mask, as shown in FIG. 3(n), for formation of counter electrodes 7.

Subsequently, a sealing plate 17 of glass was bonded to the resulting substrate with a UV-curable resin in nitrogen gas as shown in FIG. 3(o). Further, a polarization plate 18 was bonded to the substrate 1 for improvement of the contrast of the display device.

When scanning signals were sequentially applied to the scanning lines after a power source was connected to the signal lines of the light emitting display device of active matrix drive type thus fabricated, light emission from every pixel was observed from the substrate side without luminous inconsistency.

Figure 5:
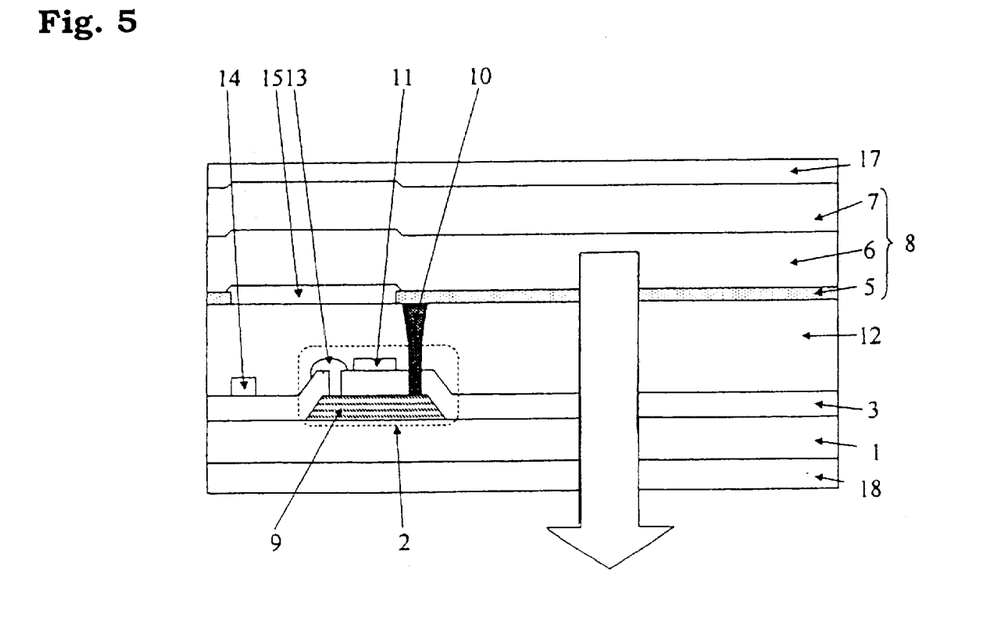
FIG. 5 is a schematic sectional view illustrating an organic LED display device of active matrix drive type according to a modification of Embodiment 1 of the present invention.

Although the organic LED layers 6 are discontinuous on the insulating film 15 in the display device of this embodiment, the organic LED layers 6 may be continuous on the insulating film 15 as shown in FIG. 5.

Embodiment 2

Figure 6:
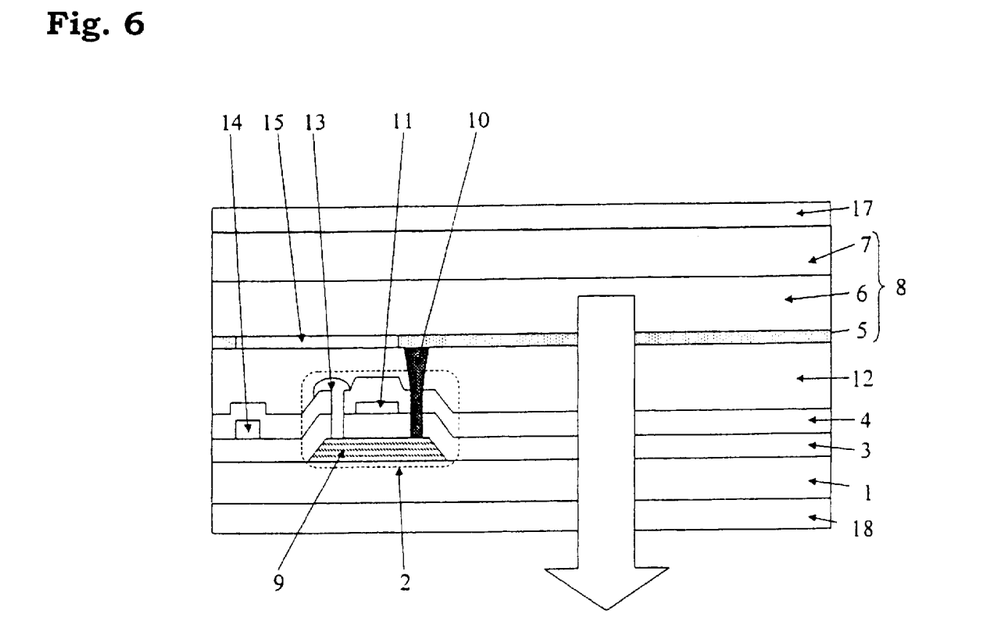
FIG. 6 is a schematic sectional view illustrating an organic LED display device of active matrix drive type according to Embodiment 2 of the present invention.

An organic LED display device of active matrix drive type according to this embodiment has substantially the same construction as the display device according to Embodiment 1, except that the planarization film 12 is provided over the thin film transistor 2 with the intervention of an interlayer insulating film 4, and the insulating film 15 provided between the pixel electrodes 5 is flush with surfaces of the pixel electrodes 5 as shown in FIG. 6.

The display device can be fabricated in substantially the same manner as in Embodiment 1, except that a 300-nm thick $SiO_2$ film is formed as an interlayer insulating film 4 after the formation of the active layers and the scanning lines, and that an insulating film is formed over the pixel electrodes formed on the planarization film, and then surfaces of the insulating film and the pixel electrodes are polished so as to simultaneously planarize the insulating film and the pixel electrodes with the insulating film being left only between the pixel electrodes.

Embodiment 3

Figure 7:
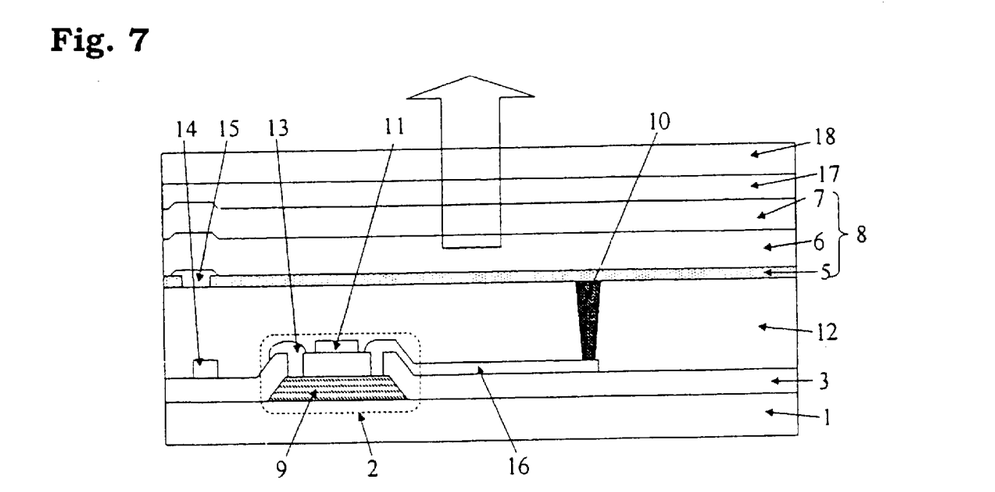
FIG. 7 is a schematic sectional view illustrating an organic LED display device of active matrix drive type according to Embodiment 3 of the present invention.
Figure 8:
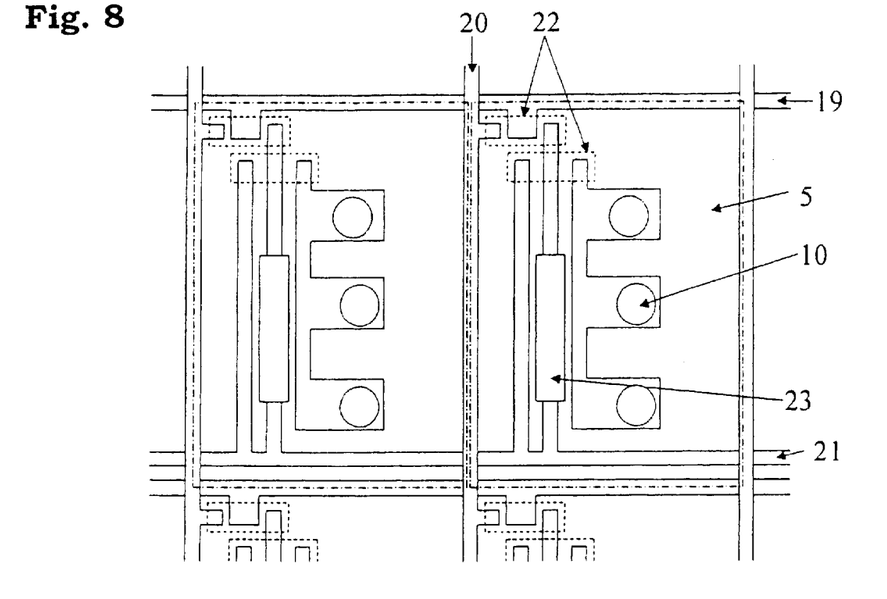
FIG. 8 is a schematic plan view illustrating the organic LED display device of active matrix drive type according to Embodiment 3 of the present invention.

An organic LED display device of active matrix drive type according to this embodiment includes at least one thin film transistor 2 and an organic LED device 8 provided on a substrate 1 for each pixel as shown in FIGS. 7 and 8.

The display device has substantially the same construction as in Embodiment 1. More specifically, the thin film transistor 2 and the organic LED device 8 each have the same structure as in Embodiment 1. A planarization film 12 is provided over the thin film transistor 2, and the organic LED device 8 is provided on the planarization film 12.

A source electrode 13 is provided on a source region of an active layer 9 of the thin film transistor 2, and a connection electrode 16 is provided on a drain region as extending from the drain region to the vicinity of the center of the pixel. The planarization film 12 has contact holes formed above the connection electrode 16 adjacent the center of the pixel, and interconnections 10 are provided in the contact holes. Thus, the drain region of the thin film transistor 2 is electrically connected to a pixel electrode 5 via the connection electrode 16 and the interconnections 10.

A tapered insulating film 15 is provided between each adjacent pair of pixel electrodes 5, and a sealing plate 17 and a polarization plate 18 are provided on a counter electrode 7.

In FIGS. 7 and 8, reference numerals 14 and 19 denote signal lines, and reference numerals 20, 21, 22 and 23 denote a signal line, a common line, thin film transistors and a capacitor, respectively.

In the display device, emitted light is outputted from a side opposite from the substrate 1. By inputting signal pulses to the signal line (first drive line) and the scanning line (second drive line), the thin film transistor is switched to actuate or deactuate the organic LED device electrically connected to the thin film transistor in the unit pixel for displaying a motion picture and a still image.

The display device was fabricated in the following manner.

A 50-nm thick α-Si film was formed on an alumina substrate 1 (thickness: 2.2 mm (±3.0%), resistance>$10^{14}$ Ω·cm, softening point: 1400° C.) by decomposing $Si_2H_6$ by an LP-CVD method, and then polycrystallized by solid phase epitaxy for formation of a polysilicon film.

Then, the polysilicon film was patterned into a predetermined configuration for formation of active layers in which channel regions and source/drain regions of thin film transistors were to be formed.

Subsequently, a 100-nm thick gate insulating film of $SiO_2$ was formed by thermal oxidization of polysilicon at not lower than 1000° C.

Thereafter, an Al film was formed on the gate insulating film by a sputtering method and patterned for formation of gate electrodes. At the same time, formation of lower electrodes (not shown) of capacitors was achieved.

In turn, side faces of the gate electrodes were subjected to anodic oxidization for formation of offset portions, and the active layers were doped with phosphorus in a high concentration by an ion doping method with the use of the gate electrodes 11 as a mask for the formation of the source/drain regions. On the resulting substrate, scanning lines 14 were formed, and then source electrodes, common electrodes and connection electrodes respectively extending from the drain regions to the vicinities of the centers of the pixels were formed by a sputtering method employing an aluminum target. Further, upper electrodes of the capacitors were formed on the resulting substrate. Thus, the formation of TFTs was achieved through a high temperature process.

A 3-μm thick $SiO_2$ film was formed as a planarization film on the resulting substrate.

A resist was applied on the planarization film, and a resist pattern was formed as having openings in contact hole formation regions by a photolithography method. With the use of the resist pattern, the planarization film was etched for formation of contact holes which each had a greater size on a pixel electrode side than on a substrate side. The contact holes were provided in center portions of the pixels. This arrangement ensures uniform current distribution in each of the pixels.

In turn, aluminum was deposited to a thickness of 3 μm on the planarization film formed with the contact holes, and then the resulting aluminum film and the planarization film were polished by 4 μm as measured from the top of the aluminum film. Thus, the aluminum film on the planarization film 12 was removed, and surfaces of the planarization film and interconnections formed in the contact holes were simultaneously planarized.

Thereafter, a 150-nm thick ITO film was formed on the planarization film by a sputtering method for electrical connection to the drain electrodes via the connection electrodes and the interconnections. For the sputtering, the substrate was kept at 300° C. The ITO film was patterned into a predetermined configuration for formation of pixel electrodes 5. The pixel electrodes 5 thus formed each had a surface resistance of lower than 10Ω/□, a transmittance of higher than 87% at 550 nm, and a flatness of ±2%.

Then, a 200-nm thick $SiO_2$ film was formed on the resulting substrate, and a resist was applied on the $SiO_2$ film and patterned for formation of a resist pattern of a predetermined configuration.

Subsequently, the $SiO_2$ film was dry-etched with the use of the resist pattern as a mask for formation of a tapered insulating film between the pixel electrodes. The tapered insulating film prevents the degradation of the devices which may otherwise occur due to field concentration at edges of the pixel electrodes and, where organic LED layers are to be formed by a transfer method, prevents the organic LED layers from suffering from a transfer failure, because a base film to be used in the transfer method as will be described later can assuredly be brought into intimate contact with the substrate.

In turn, NPD was deposited to a thickness of 50 nm on the pixel electrodes by a resistance heating evaporation method for formation of a hole transporting layer.

A red transfer plate was bonded onto the hole transporting layer, and a 13-W YAG laser was scanned over the red transfer plate so as to be applied to desired portions of the transfer plate for pattern-transferring a red light emitting layer from the transfer plate onto the hole transporting layer. A green light emitting layer and a blue light emitting layer were respectively pattern-transferred from a green transfer plate and a blue transfer plate onto the hole transporting layer in substantially the same manner. Thus, light emitting layers were formed.

Prior to the pattern transfer, the red transfer plate was prepared in the following manner. A thermosetting epoxy resin containing carbon particles was applied to a thickness of 5 μm on a 0.1-mm thick polyethylene terephthalate base film and cured at a room temperature for formation of a laser-to-heat converting layer. Then, a 1-μm thick poly(α-methylstyrene) film was formed as a heat conducting and releasing layer on the laser-to-heat converting layer, and $Alq_3$ and $DCM_2$ (4-dicyanomethylene-2-methyl-6-[2-(2,3,6,7-tetrahydro-1H,5H-benzo[ij]quinolizine-8-yl)vinyl]4H-pyran) were deposited to a thickness of 70 nm on the heat conducting and releasing layer by coevaporation thereof for formation of the red light emitting layer.

The green transfer plate was prepared in the following manner. A thermosetting epoxy resin containing carbon particles was applied to a thickness of 5 μm on a base film as described above and cured at a room temperature for formation of a laser-to-heat converting layer. Then, a 1-μm thick poly(α-methylstyrene) film was formed as a heat conducting and releasing layer on the laser-to-heat converting layer, and $Alq_3$ was deposited to a thickness of 70 nm on the heat conducting and releasing layer by evaporation thereof for formation of the green light emitting layer.

The blue transfer plate was prepared in the following manner. A thermosetting epoxy resin containing carbon particles was applied to a thickness of 5 μm on a base film as described above and cured at a room temperature for formation of a laser-to-heat converting layer. Then, a 1-μm thick poly(α-methylstyrene) film was formed as a heat conducting and releasing layer on the laser-to-heat converting layer, and DPVBi was deposited to a thickness of 70 nm on the heat conducting and releasing layer by evaporation thereof for formation of the blue light emitting layer.

Then, Al and Li were deposited to a thickness of 50 nm by coevaporation thereof for formation of counter electrodes 7.

Subsequently, an epoxy resin was applied to a thickness of 1 μm over the counter electrodes by spin coating for formation of a sealing plate 17, and a polarization plate 18 was bonded on the sealing plate.

When scanning signals were sequentially applied to the scanning lines after a power source was connected to the signal lines of the display device thus fabricated, light emission from every pixel was observed without luminous inconsistency.

Embodiment 4

Figure 9:
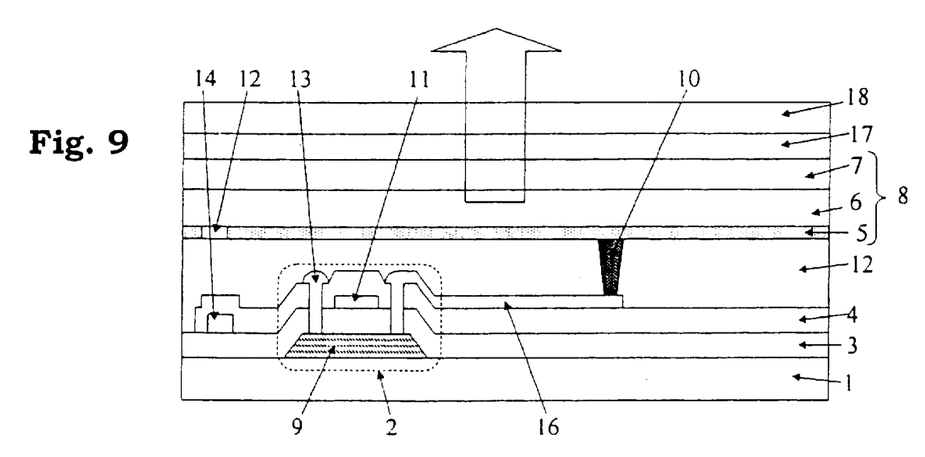
FIG. 9 is a schematic sectional view illustrating an organic LED display device of active matrix drive type according to Embodiment 4 of the present invention.

An organic LED display device of active matrix drive type according to this embodiment has substantially the same construction as in Embodiment 3, except that the planarization film 12 is provided over the thin film transistors 2 with the intervention of an interlayer insulating film 4 and the insulating film 15 provided between pixel electrodes 5 is flush with surfaces of the pixel electrodes 5 as shown in FIG. 9.

The display device was fabricated in the following manner.

A surface of an aluminum substrate 1 (thickness: 1.2 mm (±5.0%), resistance>$2.7 \times 10^{-6}$ Ω·cm, softening point: 660° C.) was subjected to anodic oxidation for formation of an $Al_2O_3$ insulating film (thickness: 150 nm (±5.0%), resistance>$10^{14}$ Ω·cm, softening point: 1400° C.).

Then, active layers, a gate insulating film, gate electrodes and lower electrodes of capacitors were formed on the resulting substrate in the same manner as in Embodiment 3. Further, source/drain regions were formed in the active layers 9, and scanning lines 14 were formed in the same manner as in Embodiment 3.

Thereafter, a 3-$\mu$m thick $SiO_2$ film was formed as an interlayer insulating film 4 on the resulting substrate. Then, source electrodes 13, common electrodes, connection electrodes 16 respectively extending from the drain regions to the vicinities of the centers of pixels, and upper electrodes of the capacitors were formed on the resulting substrate by a sputtering method employing an aluminum target. Thus, formation of TFTs was achieved through a high temperature process.

A 3-$\mu$m thick $SiO_2$ film was formed as a planarization film 12 on the resulting substrate.

A resist was applied on the planarization film 12, and a resist pattern was formed as having openings in contact hole formation regions by a photolithography method. With the use of the resist pattern, the planarization film 12 was etched for formation of contact holes which each had a greater size on a pixel electrode side than on a substrate side. The contact holes were respectively provided at the centers of the pixels. This arrangement ensures uniform current distribution in each of the pixels.

In turn, silver was deposited to a thickness of 3 $\mu$m on the planarization film 12 formed with the contact holes, and then the resulting silver film and the planarization film were polished by 4 $\mu$m as measured from the top of the silver film. Thus, the silver film on the planarization film 12 was removed, and surfaces of the planarization film and interconnections formed in the contact holes were simultaneously planarized.

Thereafter, a 100-nm thick silver film and a 30-nm thick calcium film were formed on the resulting substrate in this order by a resistance heating evaporation method and patterned into a predetermined configuration with a laser beam for formation of pixel electrodes 5 which were respectively electrically connected to the drain electrodes via the connection electrodes and the interconnections.

Then, a 200-nm thick $SiO_2$ film was formed on the resulting substrate for formation of an insulating film, and the insulating film and the pixel electrodes were polished so as to be simultaneously planarized with the insulating film being left only between the pixel electrodes. With this arrangement, the degradation of the devices is prevented which may otherwise occur due to field concentration at edges of the pixel electrodes and, where organic LED layers are to be formed by a transfer method, the organic LED layers are prevented from suffering from a transfer failure, because a base film to be used in the transfer method as will be described later can assuredly be brought into intimate contact with the substrate.

A red transfer plate was bonded onto the resulting substrate, and a 13-W YAG laser was scanned over the red transfer plate so as to be applied to desired portions of the transfer plate for pattern-transferring a red light emitting layer from the transfer plate onto the substrate. A green light emitting layer and a blue light emitting layer were respectively pattern-transferred from a green transfer plate and a blue transfer plate onto the substrate in substantially the same manner. Thus, the organic light emitting layers 6 were formed. Since the formation of the organic light emitting layers was achieved by a laser transfer method, the light emitting layers of the polymeric light emitting materials can be formed even on the pixel electrodes of calcium which is reactive with a solvent.

Prior to the pattern transfer, the red transfer plate was prepared in the following manner. A thermosetting epoxy resin containing carbon particles was applied to a thickness of 5 $\mu$m on a 0.1-mm thick polyethylene terephthalate base film and cured at a room temperature for formation of a laser-to-heat converting layer. Then, a 1-$\mu$m thick poly($\alpha$-methylstyrene) film was formed as a heat conducting and releasing layer on the laser-to-heat converting layer, and a chloroform solution of MEH-PPV was applied onto the heat conducting and releasing layer and dried for formation of a 70-nm thick red light emitting layer. Then, the resulting film was baked at 80° C. in vacuo for one hour. The heat-withstanding temperature of MEH-PPV was 180° C. The term "heat-withstanding temperature" herein means a highest possible temperature which does not deteriorate the electrical characteristics of the devices when the devices are heated for drying thereof in a fabrication process with the use of that material.

The green transfer plate was prepared in the following manner. A thermosetting epoxy resin containing carbon particles was applied to a thickness of 5 $\mu$m on a base film as described above and cured at a room temperature for formation of a laser-to-heat converting layer. Then, a 1-$\mu$m thick poly($\alpha$-methylstyrene) film was formed as a heat conducting and releasing layer on the laser-to-heat converting layer, and a chloroform solution of PPV was applied onto the heat conducting and releasing layer and dried for formation of a 70-nm thick green light emitting layer.

The blue transfer plate was prepared in the following manner. A thermosetting epoxy resin containing carbon particles was applied to a thickness of 5 $\mu$m on a base film as described above and cured at a room temperature for formation of a laser-to-heat converting layer. Then, a 1-$\mu$m thick poly($\alpha$-methylstyrene) film was formed as a heat conducting and releasing layer on the laser-to-heat converting layer, and a xylene solution of PDAF was applied onto the heat conducting and releasing layer and dried for formation of a 70-nm thick blue light emitting layer. Thereafter, the resulting film was baked at 80° C. in vacuo for one hour.

Subsequently, a hole transporting layer transfer plate was bonded onto the light emitting layers, and a 13-W YAG laser was scanned over the transfer plate so as to be applied to desired portions of the transfer plate for pattern-transferring a hole transporting layer from the transfer plate onto the light emitting layers.

Prior to the pattern transfer, the hole transporting layer transfer plate was prepared in the following manner. A thermosetting epoxy resin containing carbon particles was applied to a thickness of 5 μm on a base film as described above and cured at a room temperature for formation of a laser-to-heat converting layer. Then, a 1-μm thick poly(α-methylstyrene) film was formed as a heat conducting and releasing layer on the laser-to-heat converting layer, and a PEDT/PSS aqueous solution was applied onto the heat conducting and releasing layer and dried for formation of a 50-nm thick hole transporting layer. Thereafter, the resulting film was baked at 80° C. in vacuo for one hour.

Then, the resulting substrate was baked at 100° C. for 10 minutes.

Subsequently, IDIXO was deposited to a thickness of 150 nm over the resulting substrate by a sputtering method for formation of transparent counter electrodes 7. The counter electrodes 7 thus formed each had a surface resistance of lower than 30Ω/□, a transmittance of higher than 80% at 550 nm, and a flatness of ±2%.

Then, an epoxy resin was applied to a thickness of 1 μm over the counter electrodes 7 by spin coating for formation of a sealing plate 17, and a polarization plate 18 was bonded onto the sealing plate.

When scanning signals were sequentially applied to the scanning lines after a power source was connected to the signal lines of the light emitting display device of active drive type thus fabricated, light emission from every pixel was observed without luminous inconsistency.

Embodiment 5 (Driving Circuit)

Figure 10:
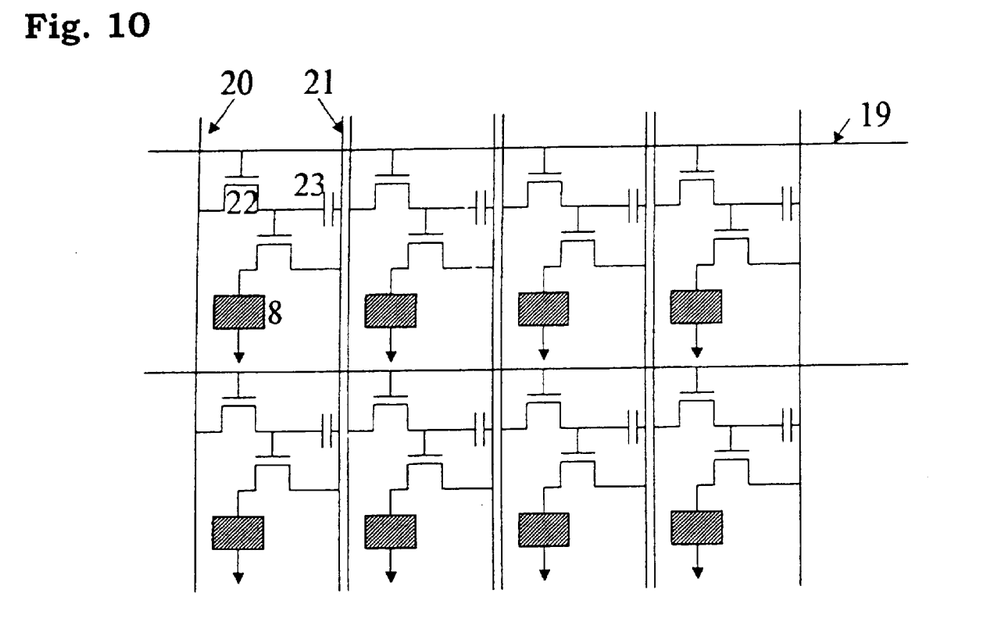
FIG. 10 is an equivalent circuit diagram for the organic LED display device of active matrix drive type according to the present invention.

In this embodiment, the display devices according to Embodiments 1 to 4 are each arranged so as to have a circuit construction as shown in FIG. 10.

In FIG. 10, two TFTs 22 and one capacitor 23 are employed in combination for driving an LED device 8 in each pixel. The TFTs 22 and the capacitor 23 are connected to a scanning line 19, a signal line 20 and a common line 21.

Embodiment 6 (Driving Circuit)

Figure 11:
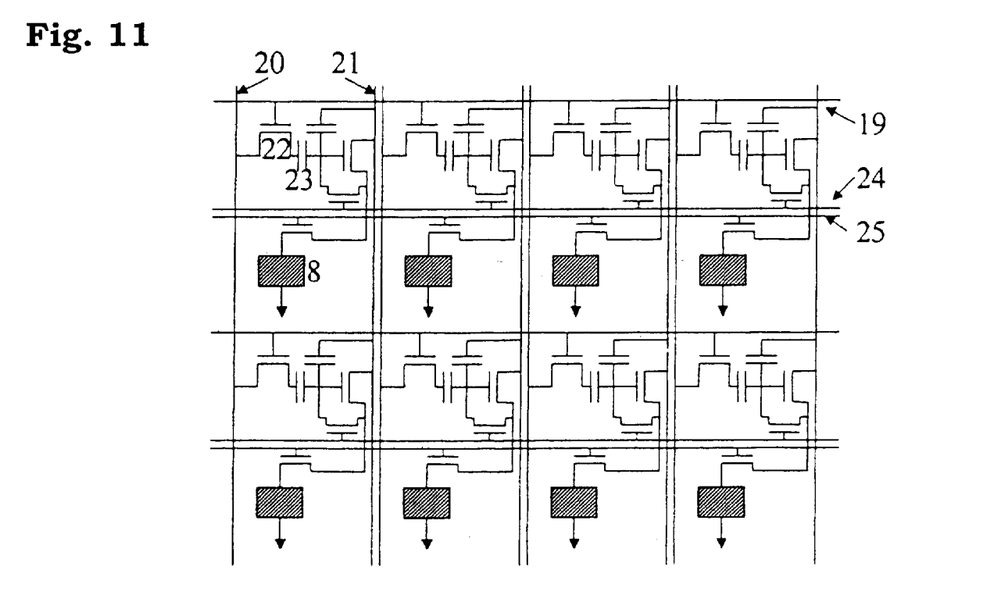
FIG. 11 is another equivalent circuit diagram for the organic LED display device of active matrix drive type according to the present invention.

In this embodiment, the display devices according to Embodiments 1 to 4 are each arranged so as to have a circuit construction as shown in FIG. 11.

In FIG. 11, four TFTs 22 and two capacitors 23 are employed in combination for driving an LED device 8 in each pixel. The TFTs 22 and the capacitors 23 are connected to a scanning line 19, a signal line 20, a common line 21, a first drive line 24, and a second drive line 25.

In accordance with the present invention, the pixel electrodes are formed independently of the interconnections, so that the layer underlying the pixel electrodes and the pixel electrodes can be planarized as much as possible. This prevents the inter-electrode short attributed to undulations on the pixel electrodes, the degradation due to the field concentration, and the deterioration in display quality due to variations in luminance.

Particularly, where the interconnection and the pixel electrode in each pixel are to be formed of different electrically conductive materials, the formation of the interconnection in a small contact hole can be achieved by employing a metal material having a sufficiently high electrical conductivity. Further, a transparent electrode typically used as the pixel electrode generally has a high resistance and, therefore, it is advantageous to employ different electrically conductive materials for the formation of the pixel electrode and the interconnection.

Where a plurality of interconnections are provided in each pixel, a current can uniformly be distributed in each pixel. Therefore, display inconsistency can be prevented which may otherwise occur due to nonuniform current distribution.

Where at least one interconnection is provided adjacent the center of each pixel, uniform current distribution in each pixel can be ensured even with the single interconnection. Therefore, the display inconsistency can be prevented.

Where the interconnection is designed to have a greater area on a pixel electrode side than on a substrate side (on a drain electrode side), the interconnection can assuredly be formed in the contact hole without breakage thereof.

In the method for fabricating the aforesaid display device in accordance with the present invention, the interconnections are formed in the contact holes formed in the planarization film, and then the pixel electrodes are formed independently of the interconnections on the planarization film formed with the interconnections. Therefore, undulations on the surfaces of the pixel electrodes can be suppressed as much as possible. The display device thus fabricated is free from the inter-electrode short attributed to the undulations on the pixel electrodes, the degradation due to the field concentration, and the deterioration in display quality due to variations in luminance.

Particularly, where an electrically conductive interconnection material is deposited on the planarization film formed with the contact holes and polished for the formation of the interconnections in the contact holes and for planarization of the surface of the planarization film, the fabrication of the display device can be achieved through a simplified process without addition of a special step and without increase in production costs.

Where at least the light emitting layer of the organic LED layer is formed by a transfer method or a printing method, the organic LED layer can evenly be formed on the flat pixel electrodes without undulations. Therefore, the display device thus fabricated has a further excellent display quality.

What is claimed is:

1. An organic LED display device of active matrix drive type comprising:

a substrate;

a thin film transistor supported by the substrate;

a planarization film provided over the thin film transistor; and an organic LED device provided on the planarization film, and the organic LED device comprising an entirely planar conductive pixel electrode on a planar surface of the planarization film and electrically connected to a drain electrode of the thin film transistor via a conductive interconnection extending through a contact hole in the planarization film, an organic LED layer comprising at least one organic light emitting layer and a counter electrode;

the thin film transistor being operative to control one of a current and a voltage to be applied to the LED device;

wherein the interconnection includes an end face flush with a surface of the planarization film on the side of a pixel electrode.

2. A display device as set forth in claim 1, wherein the interconnection includes a plurality of interconnections.

3. A display device as set forth in claim 1, wherein the interconnection includes at least one interconnection provided adjacent a center of the organic LED device.

4. A display device as set forth in claim 1, wherein the interconnection has a greater end face area on the side of the pixel electrode side than on the side of the drain electrode side.

5. The LED display device of claim 1, wherein the interconnection is of a different conductive material than the pixel electrode.

6. A method for fabricating an organic LED display device of active matrix drive type which comprises an organic LED device and a thin film transistor connected to the organic LED device for controlling a current or a voltage to be applied to the LED device, the method comprising:

forming the thin film transistor on a substrate;

forming a planarization film over the thin film transistor;

forming a contact hole in the planarization film;

forming a conductive interconnection in the contact hole so as to have an end face flush with a planar surface of the planarization film;

forming an entirely planar pixel electrode on the planar surface of the planarization film and over the interconnection so that the pixel electrode is in electrical communication with the transistor via the interconnection;

forming an organic LED layer including at least one light emitting layer on the pixel electrode; and forming a counter electrode on the organic LED layer.

7. A method as set forth in claim 6, wherein the interconnection forming step comprises the steps of depositing an electrically conductive interconnection material on the planarization film formed with the contact hole, and polishing away the resulting layer of the electrically conductive material to planarize the planarization film with the electrically conductive interconnection material being left in the contact hole for the formation of the interconnection in the contact hole.

8. A method as set forth in claim 6, wherein the organic LED layer forming step comprises the step of forming the at least one light emitting layer by one of a transfer method and a printing method.

9. The method of claim 6, wherein the interconnection is of a different conductive material than the pixel electrode.

* * * * *